(12) United States Patent
Dearden et al.

(10) Patent No.: US 6,417,747 B1
(45) Date of Patent: Jul. 9, 2002

(54) LOW COST, LARGE SCALE RF HYBRID PACKAGE FOR SIMPLE ASSEMBLY ONTO MIXED SIGNAL PRINTED WIRING BOARDS

(75) Inventors: Timothy E. Dearden, Torrance; Jeffrey J. Stitt, Placentia; Clifton Quan, Arcadia, all of CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/935,496

(22) Filed: Aug. 23, 2001

(51) Int. Cl.$^7$ .............................. H01P 1/00; H01P 5/00; H03H 7/38
(52) U.S. Cl. ..................... 333/247; 333/260; 333/33
(58) Field of Search ................................ 333/247, 260, 333/103, 160, 181, 33, 243; 174/254; 257/773; 312/368; 439/581

(56) References Cited

U.S. PATENT DOCUMENTS

| | | | |
|---|---|---|---|
| 5,304,964 A | * 4/1994 | DiMarco | 333/181 |
| 5,552,752 A | 9/1996 | Sturdivant et al. | 333/243 |
| 5,570,068 A | 10/1996 | Quan | 333/33 |
| 5,618,205 A | 4/1997 | Riddle et al. | 439/581 |
| 5,631,446 A | * 5/1997 | Quan | 174/254 |
| 5,633,615 A | 5/1997 | Quan | 333/33 |
| 5,668,509 A | 9/1997 | Hoffmeister et al. | 333/33 |
| 5,675,302 A | 10/1997 | Howard et al. | 333/243 |
| 5,689,216 A | 11/1997 | Sturdivant | 333/33 |
| 5,703,599 A | 12/1997 | Quan et al. | 342/368 |
| 5,982,338 A | 11/1999 | Wong | 343/853 |
| 6,236,287 B1 | 5/2001 | Quan et al. | 333/33 |
| 6,239,359 B1 | * 5/2002 | Lilienthal et al. | 174/35 GC |

OTHER PUBLICATIONS

Product Data Sheet for CIN ASPE Stacking Connector, Cinch Connectors, 7 pages, 1991.
Product Data Sheet for SMP Series Connectors, Connecting Devices, Inc., 3 pages (Undated).
Product Data Sheet for Gilbert GPO Interconnect System, Gilbert Engineering Co., 4 pages, 1992.

* cited by examiner

Primary Examiner—Patrick Wamsley
(74) Attorney, Agent, or Firm—Leonard A. Alkov; Glenn H. Lenzen, Jr.

(57) ABSTRACT

An RF interconnect is incorporated in RF module packages for direct attachment onto a multi-layer PWB using compressible center conductor (fuzz button) interconnects. The module has circuitry operating at microwave frequencies. The module package includes a metal housing including a metal bottom wall structure. The module includes a plurality of RF interconnects, which provide RF interconnection between the package and the PWB. Each interconnect includes a feedthrough center pin protruding through an opening formed in the metal bottom wall, with isolation provided by a dielectric feedthrough insulator. The center pin is surrounded with a ring of shield pins attached to the external surface of the bottom wall of the module housing. The pins are insertable in holes formed in the PWB, and make contact with fuzz button interconnects disposed in the holes. Circuitry connects the fuzz button interconnects to appropriate levels of the PWB for grounding and RF signal conduction.

17 Claims, 4 Drawing Sheets

LOW COST, LARGE SCALE RF HYBRID PACKAGE FOR SIMPLE ASSEMBLY ONTO MIXED SIGNAL PRINTED WIRING BOARDS

TECHNICAL FIELD OF THE INVENTION

This invention related to microwave circuits, and more particularly to RF interconnect techniques.

BACKGROUND OF THE DISCLOSURE

Known techniques for interconnecting MIC (Microwave Integrated Circuit) modules directly onto RF printed wiring boards (PWBs) includes coaxial cables or ribbons and connectors. The disadvantage to these techniques are size, weight, and cost. There are also reliability issues due to coefficient of thermal expansion (CTE) mismatches associated with the different packaging materials when direct solder and epoxy attach is used to mount these modules onto a PWB.

SUMMARY OF THE DISCLOSURE

This invention offers a new, robust, serviceable and compact approach to microwave packaging. Separate and individual MIC modules can now be easily mounted and removed vertically, saving valuable real estate and height.

An RF interconnect is incorporated in RF module packages for direct attachment onto a multi-layer PWB using compressible center conductor (fuzz button) interconnects. The module has circuitry operating at microwave frequencies. The module package includes a metal housing including a metal bottom wall structure. The module includes a plurality of RF interconnects, which provide RF interconnection between the package and the PWB. Each interconnect includes a feedthrough center pin protruding through an opening formed in the metal bottom wall, with isolation provided by a dielectric feedthrough insulator. The center pin is surrounded with a ring of shield pins attached to the external surface of the bottom wall of the module housing. The pins are insertable in holes formed in the PWB, and make contact with fuzz button interconnects disposed in the holes. Circuitry connects the fuzz button interconnects to appropriate levels of the PWB for grounding and RF signal conduction.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE DISCLOSURE

In accordance with an aspect of the invention, an RF interconnect is incorporated in large multifunction RF module hybrid packages for direct board attachment onto a mixed signal multi-layer PWB using compressible conductor (fuzz button) interconnects. The module hybrid package typically contains one or more hybrid circuits, i.e. active devices mounted on a substrate, in turn mounted in the package housing. The module hybrid package operates at microwave frequencies. The interconnect in accordance with aspects of the invention provides highly reliable connection at elevated temperatures, and does not require use of coaxial cables and connectors.

Figure 1C:
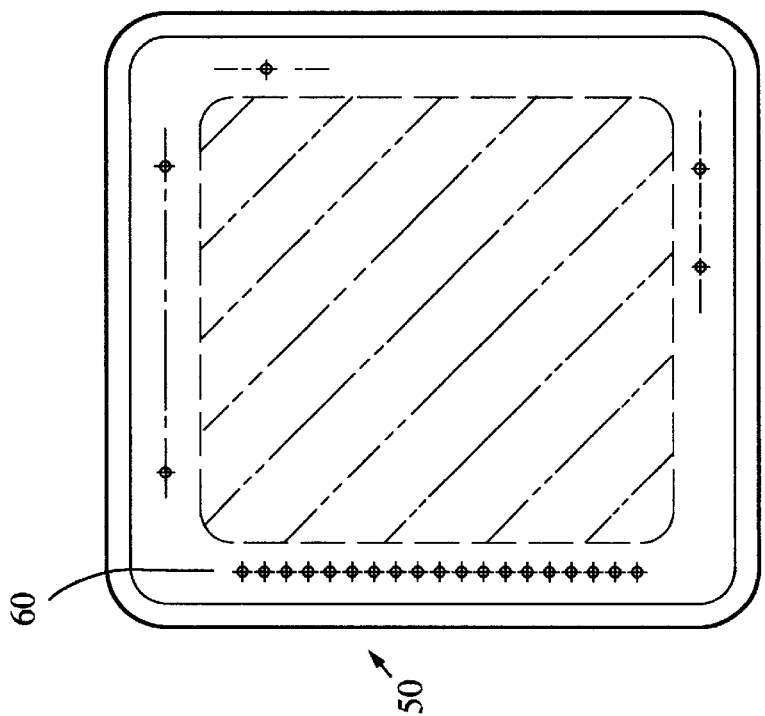
FIG. 1C is a top view of the module package of FIG. 1A.
Figure 1B:
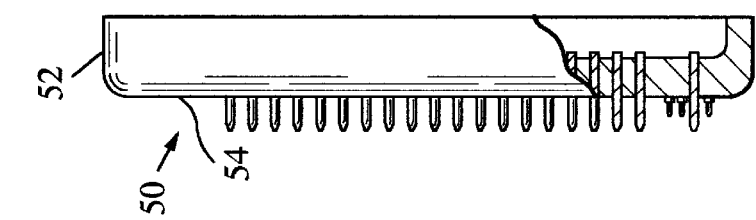
FIG. 1B is a side, partially-broken away view of the module package of FIG. 1B.
Figure 1A:
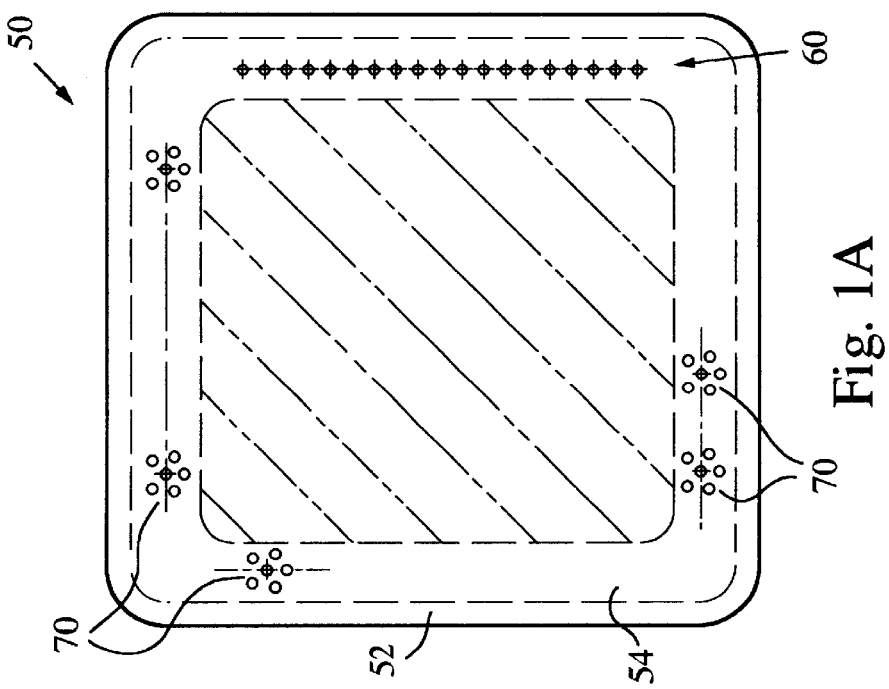
FIG. 1A is a bottom external view of a multifunction RF module package embodying aspects of the invention.

FIGS. 1A–1C depict an exemplary embodiment of a module package 50 embodying the invention. The package 50 includes a metal housing 52 including a metal bottom wall structure 54, with one or more hybrid circuits positioned within. The housing has protruding from the bottom wall an interconnect strip of conventional DC signal pins 60, for mating with corresponding DC connector terminals.

Figure 2:
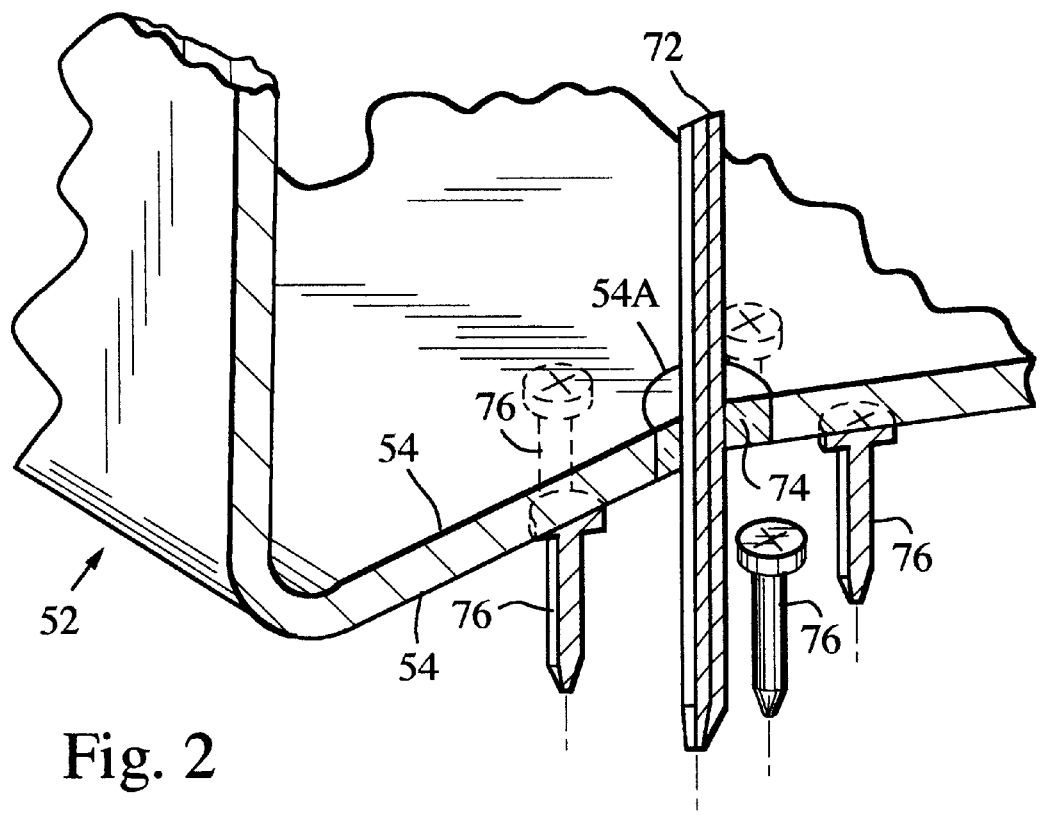
FIG. 2 is an isometric cross-sectional view illustrating an RF interconnect in accordance with aspects of the invention.

The module 50 further includes a plurality of RF interconnects 70 in accordance with the invention, which are adapted to provide RF interconnection between the package 50 and a multi-layer PWB. In an exemplary embodiment, each RF interconnect 70 includes a standard 50 ohm feedthrough center pin 72 (FIG. 2) protruding through an opening 54A formed in the metal bottom wall 54. The pin 72 is secured in the opening and isolated from the metal wall by a glass feedthrough insulator 74. The pin 72 is surrounded with a ring of smaller shield pins 76 attached to the external surface 54B of the bottom wall 54 of the module housing 52. The pins 76 are arranged about the center pin to provide an RF shield about the pin 72, and in this exemplary embodiment are brazed directly to the metal wall 54, while the center pin 72 extends from the 50 ohm glass feedthrough 74.

Figure 3:
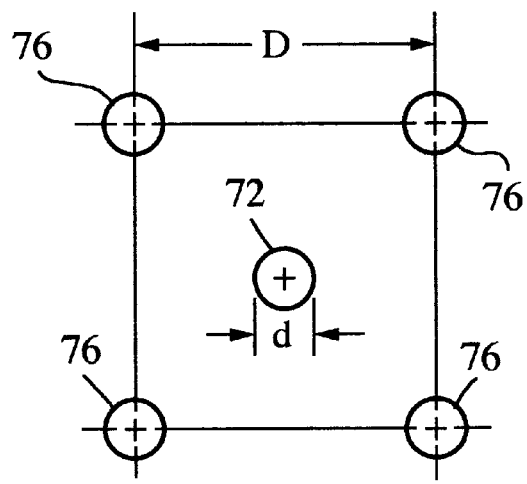
FIG. 3 is a schematic view of an RF center pin surrounding by RF ground pins, in accordance with an aspect of the invention.

In an exemplary embodiment, four to eight of the smaller pins 76 are disposed around the RF signal pin 72 to assure good ground contact and shielding for operation into the microwave frequency range up to C-band. This is accomplished by choosing the diameter and spacing of the pins 76 surrounding the center pin extending for the 50 ohm feedthrough as illustrated in FIG. 3 for the cases of the RF center pin 72 surrounded by four RF ground pins 76 for shielding. Thus, for the case of a center pin 72 having a diameter d, and the four pins 76 are spaced at distance D from adjacent shield pins on the corners of a square, the characteristic impedance of the RF interconnect, is given by:

$$Z_0 = (173/\epsilon^{1/2})\log 10(D/0.933d),$$

for d<D.

See, "Reference Data for Engineers: Radio, Electronics, Computers and Communications," Seventh Edition, Howard S. Sam & Company, 1985. Additional RF ground pins 76 can be used to surround the RF center pin for improved shielding. These cases can be modeled using available software tools to determine the dimensions for 50 ohm transmission line. These software tools include Hewlett Packard HFSS, Sonnet and Ansoft Eminence.

This technique is different from the conventional ball grid array (BGA) and pin grid array (PGA) packages whose sphere and pins are attached to a dielectric substrate. This module package eliminates the need for coaxial connectors and coaxial cables for the RF interconnection. Another advantage is that the mounting and attachment of the RF and DC/Signal interconnect uses the same assembly process so that all the interconnects can be attached simultaneously. This invention provides a superior interconnect approach to conventional gold bonding operation.

On the PWB side, compressible wire, or "fuzz button," interconnects offer a simple, inexpensive, and test-friendly connection technique in comparison to the use of convention coaxial connectors to interface the PWB. In an exemplary embodiment, the fuzz button interconnects are fabricated of densely packed thin gold plated wire, in a generally cylindrical configuration to fit into holes drilled into the PWB. The fuzz button interconnects can be smaller and lighter than commercial coaxial connectors, and can be packaged more densely. This technique also enables the package to be field removable and replaceable. An RF gasket may be needed to absorb the z-axis CTE mismatch, but this is inexpensive and easy to obtain. Fuzz buttons have been tested up to 8 W of input power but can potentially handle much higher levels.

Figure 4:
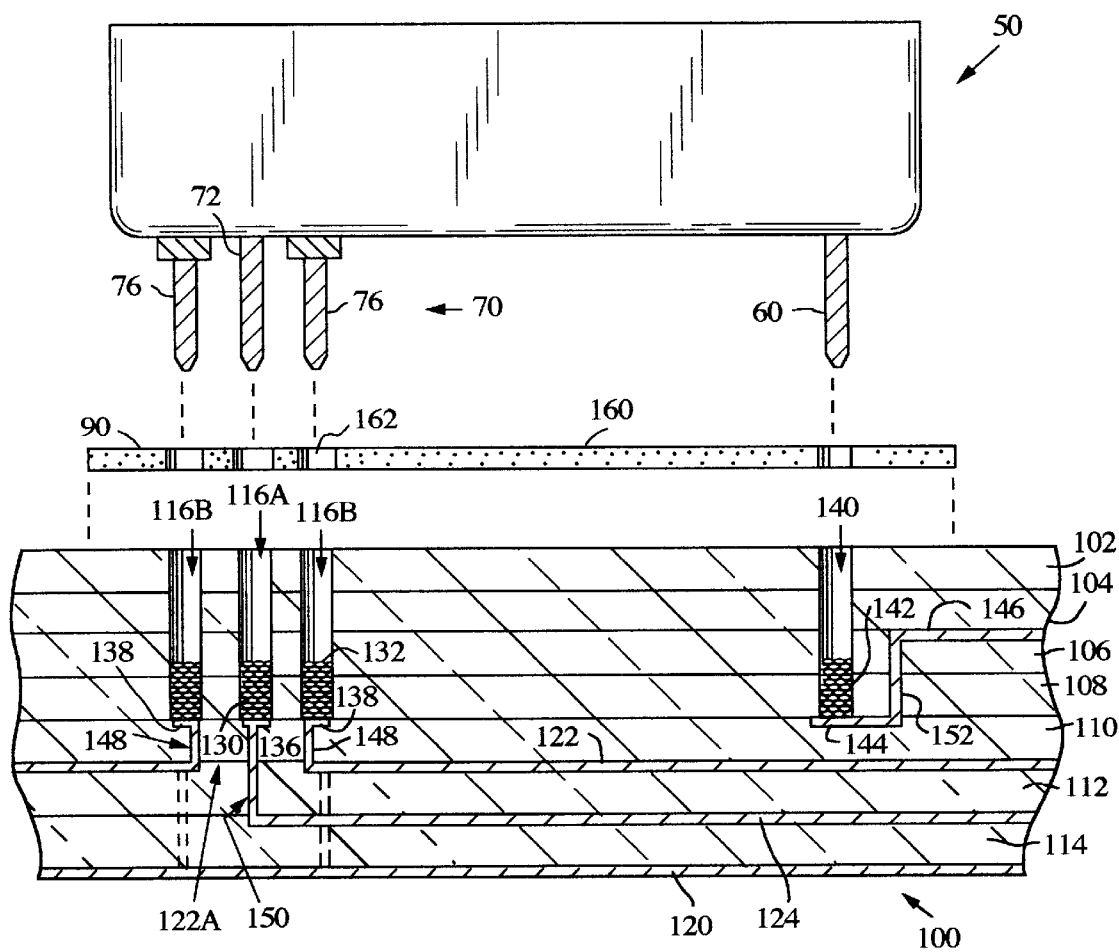
FIG. 4 is an exploded cross-sectional view of an RF module package and a mixed signal multi-layer PWB, illustrating the interconnectIon of these structures.

The fuzz button interconnects are inserted into pre-drilled holes 116A, 116B within the integrated RF/DC or mixed signal PWB 100, as shown in FIG. 4. The PWB 100 includes a plurality of PWB layers, in this example layers 102–114. The layers include layers of dielectric material such as Duroid™, a glass-woven Teflon™ material, polyimide or epoxy glass. The layers can be fabricated of different materials, depending on the frequency range of the signals carried in the different layers, with Duroid (™) preferable for high frequency operation. The bottom two layers 114, 112 define a stripline transmission line, including the lower and upper stripline ground planes 120, 122 formed respectively on the bottom surface of layer 114 and the top surface of layer 112. An RF conductor trace 124 is formed on the top surface of layer 114, to provide the stripline conductor trace. An opening 122A is formed in the upper ground plane 122, where an RF interconnect terminal is formed. The holes 116A and 116B are drilled in the PWB layers to a depth extending to the top surface of PWB layer 110. Disposed within each hole is a fuzz button interconnect structure. Thus for the center pin 72, fuzz button interconnect structure 130 is inserted into the hole 116A. For the shield pins 74, fuzz button interconnect structures 132 are respectively disposed in the holes 116B. For the DC signal pins, a hole 140 is drilled into the PWB 100 to the top surface of layer 110, and a fuzz button interconnect structure is inserted into the hole 140. At the bottom of each drilled hole is a conductor pad formed on the top surface of layer 112. Thus pad 136 is formed on the layer 112 at the hole 116A, and pads 138 are formed on the layer 112 in registration with the holes 116B. Pad 144 is formed on the layer 110 in registration with hole 140. Each pad is connected to a plated through hole going to various layers within the PWB. At the various PWB layers are the DC/signal lines 146, DC powerplanes (i.e. a layer of copper or other conductor to which a voltage is applied), RF groundplanes 120, 122, and RF transmission lines 124. Pads 138 are connected to ground planes 122, 120 by plated through holes 148. Pad 136 is connected to the RF transmission line 124 by plated through hole 150. The DC signal pad 144 is connected, to DC conductor trace 146 by plated through hole 152.

Figure 5:
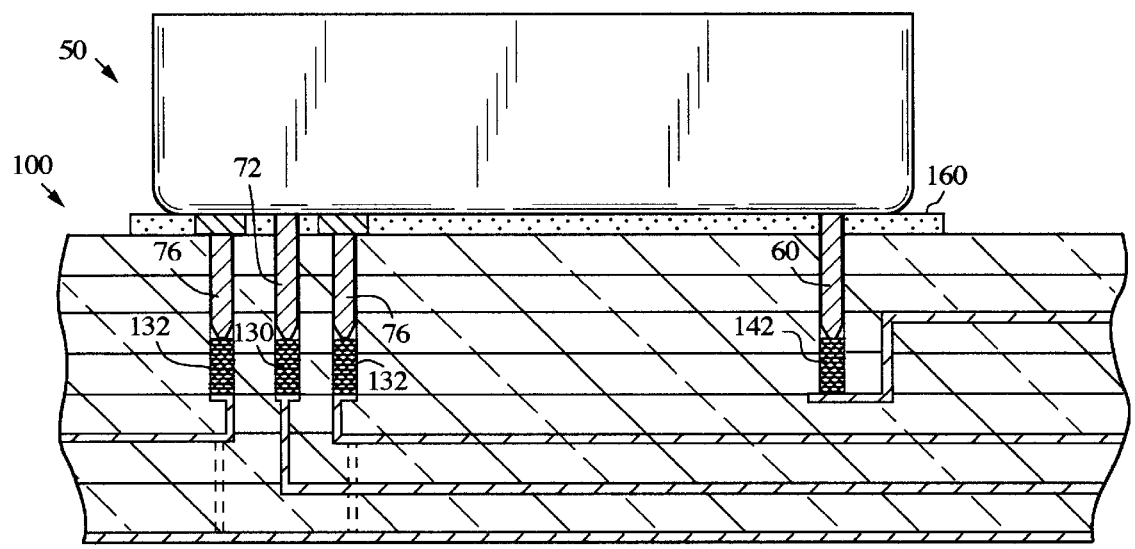
FIG. 5 is a view similar to FIG. 4, but showing the RF module package interconnected with the PWB structure.

The package 50 can be mounted onto the PWB 100 using a variety of techniques, including adhesive film 160 as shown in FIGS. 4–5, mechanical clamps and threaded fasteners. The film 160 has a plurality of clearance holes 162 formed therein to receive therethrough the pins 60, 72, 76 when the package 50 is assembled to the PWB 100.

FIG. 5 is similar to FIG. 4, but illustrates the package 50 in an inserted, fully assembled state relative to the PWB 100. The tips of the pins 60, 72, 76 are brought into contact with the ends of the fuzz button interconnects 130, 132, 142, making electrical contact therewith. The package 50 is secured to the PWB 100 by the adhesive film 160, which is preferably a double-sided adhesive layer structure.

Figure 6:
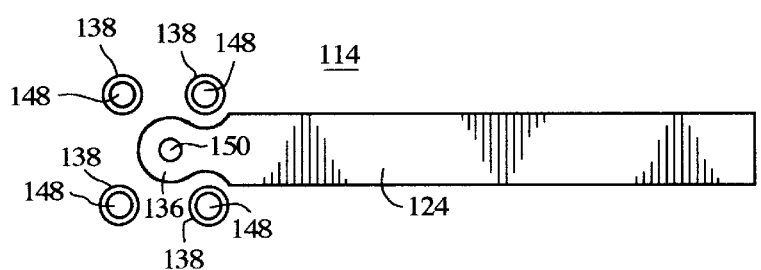
FIG. 6 is a top view of a stripline conductor trace surrounded by RF ground pads and plated through holes.

The stripline conductor trace 124 on the top surface of layer 114 is not in contact with the RF ground plated through holes 148 on pads 138, but is routed between them as shown in FIG. 6. Here the RF conductor pad 136 contacting the RF center conductor plated through hole 150 is routed between the ground pads 138 and plated through holes 148.

The interconnect technique involves inserting the pins from the RF/DC module into the pre-drilled holes of the PWB containing the fuzz button interconnects. The pins compress the fuzz button contact against the conductor pad within the PWB and completing the connection to the various RF and DC/signal layers as shown in FIG. 5.

This new interconnect approach with this RF module hybrid package eliminates the need for coaxial connector and coaxial cables for the RF interconnection interfacing the PWB. Another advantage is that the mounting and attachment of the RF and DC/Signal interconnect uses the same assembly process so that all the interconnects can be attached simultaneously.

Fuzz button interconnects offer a simple, cheap, and test friendly connection method. They are smaller and lighter than commercial coaxial connectors, and also allow the RF module hybrid package also known as MIC (Microwave Integrated Circuit) package to be field removable and replaceable.

An exemplary use is to carry RF signals between MIC modules directly attached to a RF PWB, providing advantages including low loss, minimal space, low cost, single mode transmission, and vertical transition. Applications can include vertical interconnects between stacked and removable RF assemblies, which can be found in receiver/exciters, communication subsystems, and other microwave circuits. Such circuits can be found in radar systems, satellites, microwave automobile electronics, missiles systems, and other applications where size is important (e.g. cellular phones).

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. An RF electrical assembly, comprising:
    an RF package comprising:
        an external housing including a wall structure having an interconnect opening formed therein;
        an electrically conductive feed-through pin structure mounted in the interconnect opening, the pin structure including an elongated electrically conductive center pin supported on a dielectric spacer element in the interconnect opening, the center pin having an interior end disposed within the housing for connection to RF circuitry, and a distal end for interconnection with an interconnection structure external to the RF package;
        a plurality of electrically conductive shield pins connected to the wall structure and extending outwardly from the housing and disposed to surround an external portion of the center pin to form a coaxial shield structure; and a multi-layer printed wiring board (PWB) electrically connected to the RF package through said pin and coaxial shield structure, the PWB including:
- a center pin hole formed through a first surface to a first predetermined depth;
- a plurality of shield pin holes formed through said first surface to a second predetermined depth;
- a center pin compressible wire interconnect structure disposed in said center pin hole to make electrical contact with a distal tip of the center pin when the package is assembled to the PWB;
- a plurality of shield pin compressible wire bundle interconnect structures disposed in said shield pin holes to make electrical contact with respective distal tips of the shield pins when the package is assembled to the PWB.

2. The assembly of claim 1, further including an attachment structure for securing the RF package to the PWB when the package is assembled to the PWB.

3. The assembly of claim 2, wherein the attachment structure includes an adhesive layer.

4. The assembly of claim 1, wherein the package further includes at least one DC signal pin extending through the wall structure and having an interior end for connection to a DC circuit within the housing and an exterior end extending away from the wall structure for connection to a DC interconnect structure on the PWB.

5. The assembly of claim 4 wherein the DC interconnect structure includes a DC pin hole formed through the first surface of the PWB to a third predetermined depth of said PWB, and a DC pin hole compressible wire bundle interconnect structure disposed in said pin hole to make electrical contact with the distal tip of the DC pin when the package is assembled to the PWB.

6. The assembly of claim 1, wherein the compressible wire bundles are fabricated of densely packed thin gold plated wire.

7. The assembly of claim 1, wherein the first predetermined distance is equal to the second predetermined distance.

8. The assembly of claim 1, wherein the PWB includes an RF stripline transmission line defined by first and second ground plane conductive layers sandwiching a stripline conductor, and wherein said center pin compressible wire interconnect structure is in contact with a conductive pad or trace in turn electrically connected to said stripline conductor, and said shield pin compressible wire bundle interconnect structures are each in contact with a conductive pad or trace in turn electrically connected to each of said first and second ground plane structures.

9. The assembly of claim 1 wherein the wall structure is fabricated of metal.

10. An RF electrical assembly, comprising:
an RF package comprising:
- an external housing including a wall structure having an interconnect opening formed therein;
- an electrically conductive feed-through pin structure mounted in the interconnect opening, the pin structure including an elongated electrically conductive pin supported on a dielectric spacer element in the interconnect opening, the pin having an interior end disposed within the housing for connection to RF circuitry, and a distal end for interconnection with an interconnection structure external to the RF package;
- a plurality of electrically conductive shield pins connected to the wall structure and extending outwardly from the housing and disposed to surround an external portion of the center pin to form a coaxial shield structure; and
a multi-layer printed wiring board (PWB) electrically connected to the RF package through said pin and coaxial shield structure, the PWB including:
- a center pin hole formed through a first surface to a first predetermined depth to a layer having an RF conductive trace defined thereon;
- a plurality of shield pin holes formed through said first surface to a second predetermined depth to respective conductive pads connected to a ground plane;
- a center pin compressible wire interconnect structure disposed in said center pin hole to make electrical contact with a distal tip of the center pin when the package is assembled to the PWB;
- a plurality of shield pin compressible wire bundle interconnect structures disposed in said shield pin holes to make electrical contact with respective distal tips of the shield pins when the package is assembled to the PWB.

11. The assembly of claim 10, further including an attachment structure for securing the RF package to the PWB when the package is assembled to the PWB.

12. The assembly of claim 11, wherein the attachment structure includes an adhesive layer.

13. The assembly of claim 10, wherein the package further includes at least one DC signal pin extending through the wall structure and having an interior end for connection to a DC circuit within the housing and an exterior end extending away from the wall structure for connection to a DC interconnect structure on the PWB.

14. The assembly of claim 13 wherein the DC interconnect structure includes a DC pin hole formed through the first surface of the PWB to a third predetermined depth to a signal pad formed on a layer of said PWB, and a DC pin hole compressible wire bundle interconnect structure disposed in said pin hole to make electrical contact with the distal tip of the DC pin when the package is assembled to the PWB.

15. The assembly of claim 10, wherein the compressible wire bundles are fabricated of densely packed thin gold plated wire.

16. The assembly of claim 10, wherein the first predetermined distance is equal to the second predetermined distance.

17. An RF assembly including an RF interconnect structure incorporated in an RF module package for direct attachment onto a multi-layer printed wiring board (PWB) using compressible center conductor interconnects, the RF module package having circuitry operating at microwave frequencies, a metal housing including a metal bottom wall structure, the module including a plurality of RF interconnects, which provide RF interconnection between the package and the PWB, each interconnect including a feedthrough center pin protruding through an opening formed in the metal bottom wall, with isolation provided by a dielectric feedthrough insulator, and a ring of shield pins attached to the external surface of the bottom wall of the module housing and surrounding a protruding portion of the center pin, the center and shield pins insertable in holes formed in the PWB to make contact with corresponding compressible conductor interconnects disposed in the holes, the PWB including circuitry connecting the compressible conductor interconnects to appropriate levels of the PWB for grounding and RF signal conduction.

* * * * *